(12) United States Patent
Au et al.

(10) Patent No.: US 6,309,927 B1
(45) Date of Patent: *Oct. 30, 2001

(54) METHOD OF FORMING HIGH K TANTALUM PENTOXIDE $TA_2O_5$ INSTEAD OF ONO STACKED FILMS TO INCREASE COUPLING RATIO AND IMPROVE RELIABILITY FOR FLASH MEMORY DEVICES

(75) Inventors: Kenneth Wo-Wai Au, Fremont; Kent Kuohua Chang, Cupertino; David Chi, Sunnyvale, all of CA (US)

(73) Assignee: Advanced Micro Devices, Inc., Sunnyvale, CA (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/263,983
(22) Filed: Mar. 5, 1999
(51) Int. Cl.⁷ .............................................. H01L 21/8247
(52) U.S. Cl. ........................................... 438/261; 438/785
(58) Field of Search .................................. 438/257–267, 438/785

(56) References Cited

U.S. PATENT DOCUMENTS

| | | | |
|---|---|---|---|
| 4,698,787 | 10/1987 | Mukherjee et al. | 365/185 |
| 5,231,299 | 7/1993 | Ning et al. | 257/316 |
| 5,397,720 | 3/1995 | Kwong et al. | 437/40 |
| 5,420,060 | 5/1995 | Gill et al. | 437/52 |
| 5,457,336 | 10/1995 | Fang et al. | 257/322 |
| 5,467,308 | 11/1995 | Chang et al. | 365/185.01 |
| 5,496,756 | 3/1996 | Sharma et al. | 437/52 |
| 5,512,505 | 4/1996 | Yuan et al. | 437/43 |
| 5,541,436 | 7/1996 | Kwong et al. | 257/410 |
| 5,591,681 | 1/1997 | Wristers et al. | 437/240 |
| 5,654,217 | 8/1997 | Yuan et al. | 438/588 |
| 5,674,788 | 10/1997 | Wristers et al. | 437/239 |
| 6,008,091 | * 12/1999 | Gregor et al. | 438/261 |
| 6,020,238 | * 2/2000 | He et al. | 438/261 |
| 6,025,228 | * 2/2000 | Ibok et al. | 438/261 |
| 6,063,662 | * 5/2000 | Bui | 438/257 |

OTHER PUBLICATIONS

Olivo, P., Z.A. Weinberg, K.J. Stein and D.S. Wen, "Charge Trapping And Retention In Ultra–Thin Oxide–Nitride–Oxide Structures", Solid State Electronics, vol. 34, No. 6, pp. 609–611, 1991.

* cited by examiner

*Primary Examiner*—Richard Booth
(74) *Attorney, Agent, or Firm*—Renner, Otto, Boisselle & Sklar, LLP

(57) ABSTRACT

In one embodiment, the present invention relates to a method of forming a flash memory cell, involving the steps of forming a tunnel oxide on a substrate; forming a first polysilicon layer over the tunnel oxide; forming an insulating layer over the first polysilicon layer, the insulating layer comprising an oxide layer over the first polysilicon layer, and a tantalum pentoxide layer over the oxide layer, wherein the tantalum pentoxide layer is made by chemical vapor deposition at a temperature from about 200° C. to about 650° C. using an organic tantalum compound and an oxygen compound, and heating in an $N_2O$ atmosphere at a temperature from about 700° C. to about 875° C.; forming a second polysilicon layer over the insulating layer; etching at least the first polysilicon layer, the second polysilicon layer and the insulating layer, thereby defining at least one stacked gate structure; and forming a source region and a drain region in the substrate, thereby forming at least one memory cell.

30 Claims, 4 Drawing Sheets

METHOD OF FORMING HIGH K TANTALUM PENTOXIDE TA$_2$O$_5$ INSTEAD OF ONO STACKED FILMS TO INCREASE COUPLING RATIO AND IMPROVE RELIABILITY FOR FLASH MEMORY DEVICES

TECHNICAL FIELD

The present invention generally relates to flash memory devices such as EEPROMs. More particularly, the present invention relates to flash memory devices exhibiting a number of desirable characteristics including one or more of less charge trapping, less charge leakage and increased tunnel oxide reliability.

BACKGROUND ART

Nonvolatile memory devices include flash EEPROMs (electrical erasable programmable read only memory devices). FIG. 1 represents the relevant portion of a typical flash memory cell 10. The memory cell 10 typically includes a source region 12, a drain region 14 and a channel region 16 in a substrate 18; and a stacked gate structure 20 overlying the channel region 16. The stacked gate 20 includes a thin gate dielectric layer 22 (commonly referred to as the tunnel oxide) formed on the surface of the substrate 18. The stacked gate 20 also includes a polysilicon floating gate 24 which overlies the tunnel oxide 22 and an interpoly dielectric layer 26 which overlies the floating gate 24. The interpoly dielectric layer 26 is often a multilayer insulator such as an oxide-nitride-oxide (ONO) layer having two oxide layers 26a and 26b sandwiching a nitride layer 26c. Lastly, a polysilicon control gate 28 overlies the interpoly dielectric layer 26. The channel region 16 of the memory cell 10 conducts current between the source region 12 and the drain region 14 in accordance with an electric field developed in the channel region 16 by the stacked gate structure 20.

The ONO interpoly dielectric layer has a number of important functions including insulating the control gate from the floating gate. However, high temperature processes such as a wet oxidation process and long processing times are associated with the fabrication of an ONO interpoly dielectric layer. High temperatures such as 950° C. and above are undesirable because they tend to degrade polysilicon and/or tunnel oxide deleteriously increasing charge trapping. Specifically associated with forming the top oxide layer of an ONO interpoly dielectric layer using a wet oxidation process, an undesirably large amount of the nitride film may be consumed. Consequently, the resultant nitride layer is thinned which can cause charge leakage from the floating gate to the control gate. Another problem with forming the top oxide layer using a wet oxidation process is that it sometimes leads to junction problems at the nitride layer—top oxide layer interface. Long processing times makes the ONO interpoly dielectric layer fabrication process inefficient.

Even after an ONO interpoly dielectric layer is formed, there are a number of concerns. For example, if the top oxide layer is too thick, the required programming voltage increases undesirably. On the other hand, if the top oxide layer is too thin (for example, less than 10 Å), charge retention time decreases undesirably since the charge tends to leak. If the nitride layer is too thin, charge leakage from the floating gate to the control gate may be caused, further decreasing charge retention time. Precisely controlling the thicknesses of the oxide layers and the nitride layer is a notable concern. Furthermore, it is difficult to provide three successive layers having uniform and even thickness on a consistent basis.

Using alternative dielectric layers in place of conventional ONO interpoly dielectric layers is known, such as tantalum oxide based interpoly dielectric layer, but these layers do not possess or exhibit the characteristics required of high quality interpoly dielectric layers in flash memory cells.

In view of the aforementioned concerns and problems, there is a need for flash memory cells of improved quality, particularly interpoly dielectric layers having improved quality, and more efficient methods of making such memory cells.

SUMMARY OF THE INVENTION

As a result of the present invention, a flash memory cell having improved reliability is obtainable by providing an improved interpoly dielectric layer. By forming a bilayer interpoly dielectric according to the present invention, an interpoly dielectric having a low defect density, high coupling ratio, high dielectric constant, better time dependent dielectric breakdown and less interface traps is obtainable wherein charge leakage from the floating gate to the control gate is prevented while Fowler-Nordheim electron tunneling is facilitated. Moreover, forming a bilayer intelpoly dielectric in accordance with the present invention does not degrade or deleteriously effect the polysilicon layers and the tunnel oxide layer. The present invention also makes it possible to precisely control the thickness of the interpoly dielectric layer. Another advantage associated with the present invention is that the two layers of the bilayer interpoly dielectric are very compatible thereby minimizing junction problems therebetween.

In one embodiment, the present invention relates to a method of forming a flash memory cell, involving the steps of forming a tunnel oxide on a substrate; forming a first polysilicon layer over the tunnel oxide; forming an insulating layer over the first polysilicon layer, the insulating layer comprising an oxide layer over the first polysilicon layer, and a tantalum pentoxide layer over the oxide layer, wherein the tantalum pentoxide layer is made by chemical vapor deposition at a temperature from about 200° C. to about 650° C. using an organic tantalum compound and an oxygen compound, and heating in an N$_2$O atmosphere at a temperature from about 700° C. to about 875° C.; forming a second polysilicon layer over the insulating layer; etching at least the first polysilicon layer, the second polysilicon layer and the insulating layer, thereby defining at least one stacked gate structure; and forming a source region and a drain region in the substrate, thereby forming at least one memory cell.

In another embodiment, the present invention relates to a method of forming an insulating layer for a flash memory cell, involving the steps of depositing an oxide layer having a thickness from about 30 Å to about 70 Å; and depositing a tantalum pentoxide layer over the oxide layer, wherein the tantalum pentoxide layer is deposited by chemical vapor deposition using an organic tantalum compound, an oxygen compound and a carrier gas, and heating in an N$_2$O atmosphere at a temperature from about 700° C. to about 875 ° C. for a time from about 40 seconds to about 80 seconds.

In yet another embodiment, the present invention relates to a method of forming a high K interpoly dielectric layer between a floating gate and a control gate in a flash memory cell comprising a substrate, a tunnel oxide over the substrate, the floating gate over the tunnel oxide, the high K interpoly dielectric layer over the floating gate, and the control gate over the high K interpoly dielectric layer, wherein the high K interpoly dielectric layer comprises an oxide layer over the floating gate, and a tantalum pentoxide layer over the oxide layer, involving the steps of forming an oxide layer having a thickness from about 30 Å to about 70 Å at a temperature below about 900° C.; and forming a tantalum pentoxide layer over the oxide layer, wherein the tantalum pentoxide layer is deposited by chemical vapor deposition using an organic tantalum compound, an oxygen compound and a carrier gas at a temperature below about 700° C., and heating in an $N_2O$ atmosphere at a temperature below about 900° C., wherein the high K interpoly dielectric layer has a dielectric constant of at least about 20.

DISCLOSURE OF INVENTION

Figure 1:
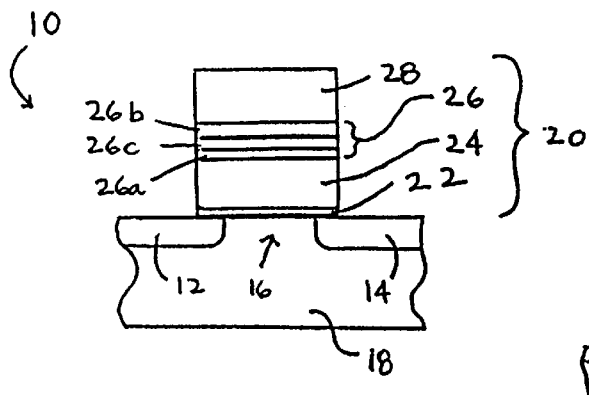
FIG. 1 is a cross-sectional view of relevant portions of a conventional memory cell in a flash memory cell.

By forming a bilayer interpoly dielectric having a high dielectric constant, a low defect density and less interface traps, the reliability of the interpoly dielectric layer can be increased in flash memory cells. While not wishing to be bound to any theory, it is believed that by forming a bilayer interpoly dielectric according to the present invention, it is consequently possible to prevent charge leakage from the floating gate to the control gate and facilitate Fowler-Nordheim electron tunneling thereby enhancing the erase operation. It is also possible to increase the coupling ratio by providing an interpoly dielectric layer with a high dielectric constant. The markedly increased coupling ratio leads to reduced applied voltage requirements which, in turn, leads to longer life of flash memory cells made in accordance with the present invention.

According to the present invention, a bilayer interpoly dielectric instead of an ONO dielectric layer (an oxide/nitride/oxide multilayer dielectric layer) is formed between the floating gate and the erase gate of a flash memory cell. The bilayer interpoly dielectric contains an oxide layer and a tantalum pentoxide layer.

An oxide layer is initially formed over the first polysilicon layer (floating gate). Any method may be employed so long as the temperature is maintained below about 950° C. In a preferred embodiment, the temperature is maintained below about 925° C. and even more preferably below about 900° C. when forming the oxide layer of the bilayer interpoly dielectric. The relatively low temperature does not degrade or increase the grain size of the first polysilicon layer.

In one embodiment, the deposition is conducted at a temperature from about 600° C. to about 850° C. and a pressure from about 400 mTorr to about 800 mTorr via low pressure chemical vapor deposition (LPCVD). In another embodiment, the deposition is conducted at a temperature from about 700° C. to about 800° C. and a pressure from about 500 mTorr to about 700 mTorr via LPCVD.

In one embodiment, the oxide layer is deposited using chemical vapor deposition (CVD) techniques, and particularly using from about 10 sccm to about 30 sccm $SiH_4$, about 0.5 l to about 2 l $N_2O$, and optionally a carrier gas. In another embodiment, the oxide layer may be deposited using from about 15 sccm to about 25 sccm $SiH_4$, about 1 l to about 1.5 l $N_2O$, and optionally a carrier gas.

In one embodiment, the oxide layer has a thickness from about 30 Å to about 70 Å. In another embodiment, the oxide layer has a thickness from about 40 Å to about 60 Å. The oxide layer has a thickness suitable to minimize or prevent subsequent processing, such as the formation of the tantalum pentoxide layer, from deleteriously effecting the first polysilicon layer. In particular, the oxide layer has a thickness suitable to minimize or prevent oxidation of the first polysilicon layer during formation of the tantalum pentoxide layer.

A tantalum pentoxide layer is formed by CVD and specifically LPCVD over the oxide layer. The tantalum pentoxide layer is a high K (high dielectric constant) tantalum pentoxide layer. That is, the dielectric constant of the tantalum pentoxide layer made in accordance with the present invention is at least about 15. In another embodiment, the dielectric constant of the tantalum pentoxide layer made in accordance with the present invention is at least about 20. In yet another embodiment, the dielectric constant of the tantalum pentoxide layer made in accordance with the present invention is at least about 25.

Forming the tantalum pentoxide by CVD is conducted at a temperature below about 700° C., and typically from about 200° C. to about 650° C. and a pressure from about 200 mTorr to about 600 mTorr. In another embodiment, the temperature is from about 300° C. to about 600° C. and the pressure is from about 250 mTorr to about 500 mTorr. In a preferred embodiment, the temperature is from about 400° C. to about 500° C. and the pressure is from about 275 mTorr to about 400 mTorr.

The gas flow includes an organic tantalum compound such as $Ta(OC_2H_5)_5$ and oxygen compound such as $O_2$. Although not generally required, the gas flow may optionally include one or more inert gases such as a noble gas or nitrogen. Nobles gases include He, Ne, Ar, Kr, and Xe. In one embodiment, however, the formation of the tantalum pentoxide layer is conducted in the absence of Ar. The gas flow generally contains a sufficient amount of $Ta(OC_2H_5)_5$ and $O_2$ to form a tantalum pentoxide layer (a $Ta_2O_5$ layer). During CVD, it is believed that the following chemical reaction takes place.

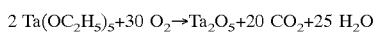

$$2\ Ta(OC_2H_5)_5 + 30\ O_2 \rightarrow Ta_2O_5 + 20\ CO_2 + 25\ H_2O$$

In one embodiment, the gas flow contains from about 5 mg/min to about 20 mg/min of the organic tantalum compound, from about 500 standard cubic centimeters per minute (sccm) to about 2,000 sccm of the oxygen compound and from about 200 sccm to about 600 sccm of the carrier gas, when present. In another embodiment, the gas flow contains from about 6 mg/min to about 15 mg/min of the organic tantalum compound, from about 750 sccm to about 1,500 sccm of the oxygen compound and from about 250 sccm to about 500 sccm of the carrier gas, when present.

After depositing the tantalum pentoxide layer by CVD, rapid thermal nitridation (RTN) is performed. RTN of the tantalum pentoxide layer is preferably conducted in an $N_2O$ atmosphere. An $N_2O$ atmosphere includes at least about 95% $N_2O$ (an inert gas constituting any remainder), preferably at least about 99% $N_2O$, and more preferably about 100% $N_2O$. In one embodiment, RTN is conducted at a temperature from about 700° C. to about 875° C. In a preferred embodiment, RTN is conducted at a temperature from about 750° C. to about 850° C. It is noted that, analogous to the oxide layer, the temperature associated with forming the tantalum pentoxide layer including RTN is maintained below about 950° C. In a preferred embodiment, the temperature is maintained below about 925° C. and even more preferably below about 900° C. when forming the tantalum pentoxide layer (including RTN) of the bilayer interpoly dielectric.

In one embodiment, RTN is conducted for a time from about 40 seconds to about 80 seconds. In a preferred embodiment, RTN is conducted for a time from about 50 seconds to about 70 seconds. The RTN serves to decrease the defect density and densify the tantalum pentoxide layer. The RTN also serves to reduce charge trapping in the tantalum pentoxide layer of the completed flash memory cell. It is believed that at elevated temperatures, $N_2O$ dissociates into nitrogen gas ($N_2$) and reactive atomic oxygen. It is also believed that the reactive atomic oxygen diffuses into the CVD tantalum pentoxide layer repairing oxygen vacancies, thereby reducing the defect density and leakage current while simultaneously densifying the layer.

After CVD and RTN, the thickness of the resultant tantalum pentoxide layer formed in accordance with the present invention is from about 100 Å to about 1,500 Å. In another embodiment, the thickness of the resultant tantalum pentoxide layer formed in accordance with the present invention is from about 150 Å to about 1,000 Å. The resultant tantalum pentoxide layer has a high dielectric constant, a substantially uniform thickness and a low defect density. Since the temperatures associated with making the bilayer interpoly dielectric according to the present invention are relatively low, the resultant flash memory cells have numerous desirable and/or improved properties compared to flash memory cells made with relatively high temperatures. That is, problems associated with relatively high temperatures are minimized and/or eliminated.

Referring to FIGS. 2A to 2H, the fabrication of a single flash memory cell is described. A plurality of flash memory cells can be formed on a semiconductor substrate, such as a silicon die, each with an N-type source region and N-type drain region formed within a P portion of the substrate and a P-type channel region interposed between the source and drain regions in accordance with the present invention. Although fabrication of one flash memory cell is described below, it will be understood by those skilled in the art that the methods described herein are applicable to mass production methods wherein two or more cells are formed.

Figure 2A:
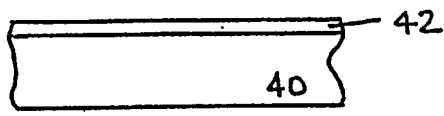
FIGS. 2A to 2H are cross-sectional views illustrating a flash memory cell fabrication method according to one embodiment of the present invention.

Specifically referring to FIG. 2A, a P-type substrate 40 is provided. Thereafter, a thin tunnel oxide layer 42 is formed over the substrate 40 having a thickness of, for example, about 50 Å to about 150 Å using a thermal growth process in a dry oxidation furnace. For instance, the tunnel oxide layer 42 can be formed via dry oxidation at a temperature of about 1050° C., under an atmosphere of oxygen at about 1.33 l, HCl at about 70 cc and argon at about 12.6 l. Alternatively, the tunnel oxide can be formed from oxynitride.

Figure 2B:
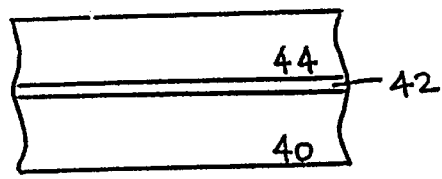

Referring to FIG. 2B, a phosphorus doped polysilicon layer is deposited via CVD to form a doped polysilicon layer 44 at 530° C., 400 mTorr, $SiH_4$ at 2000 sccm, and a mixture of 1% by weight $PH_3$ in helium at about 22 sccm. Doping lowers the resistivity of the polysilicon rendering it conductive.

Figure 2C:
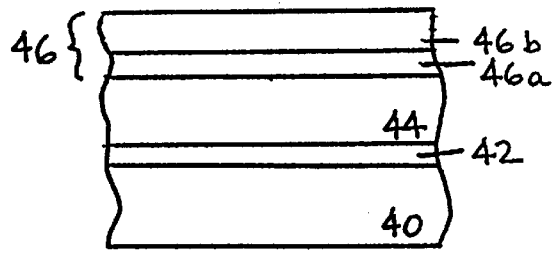

A bilayer interpoly dielectric 46 is then formed over the surface of the substrate 40, as illustrated in FIG. 2C. This layer 46 is often called the interpoly dielectric since (as will be seen shortly) it is sandwiched between the phosphorus doped polysilicon layer (first polysilicon layer constituting the floating gate for a flash memory cell) and a second polysilicon layer which forms the control gate for the cell. The interpoly dielectric 46 is preferably a two layer region of oxide/tantalum pentoxide and typically has a total thickness from about 130 Å to about 1,570 Å. Generally speaking, the bilayer interpoly dielectric 46 is formed by depositions of oxide and tantalum pentoxide to form a dielectric layer.

Specifically referring to FIG. 2C, an oxide layer 46a is deposited using CVD techniques. For example, an oxide layer 46a is deposited at a temperature of about 750° C. under $SiH_4$ at 20 sccm, $N_2O$ at 1.2 l, and a carrier gas and a pressure of about 600 mTorr via CVD on the first polysilicon layer. The oxide layer 46a may have a suitable thickness, for example, from about 30 Å to about 70 Å, but typically the thickness is about 50 Å. A tantalum pentoxide layer 46b is next formed over the oxide layer 46a also by CVD techniques using an organic tantalum compound and an oxygen compound. For example, tantalum pentoxide is formed at a temperature of about 480° C. under $O_2$ at 1,000 sccm, $Ta(OC_2H_5)_5$ at about 7.5 mg/min and He at 300 sccm and a pressure of 300 mTorr to form a tantalum pentoxide layer 46b. Next, RTN of the CVD tantalum pentoxide layer is conducted in an $N_2O$ atmosphere at a temperature of about 800° C. for about 60 seconds. The tantalum pentoxide layer 46b may have a suitable thickness, for example, from about 100 Å to about 1,500 Å, but in this embodiment, the thickness is about 250 Å.

Figure 2D:
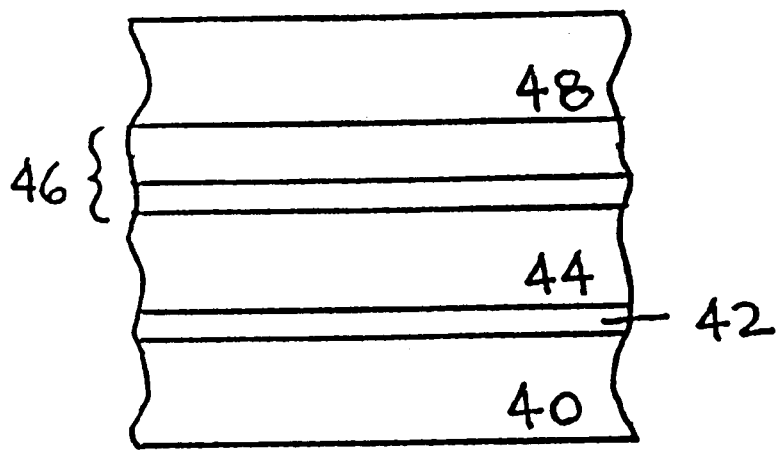
Figure 2E:
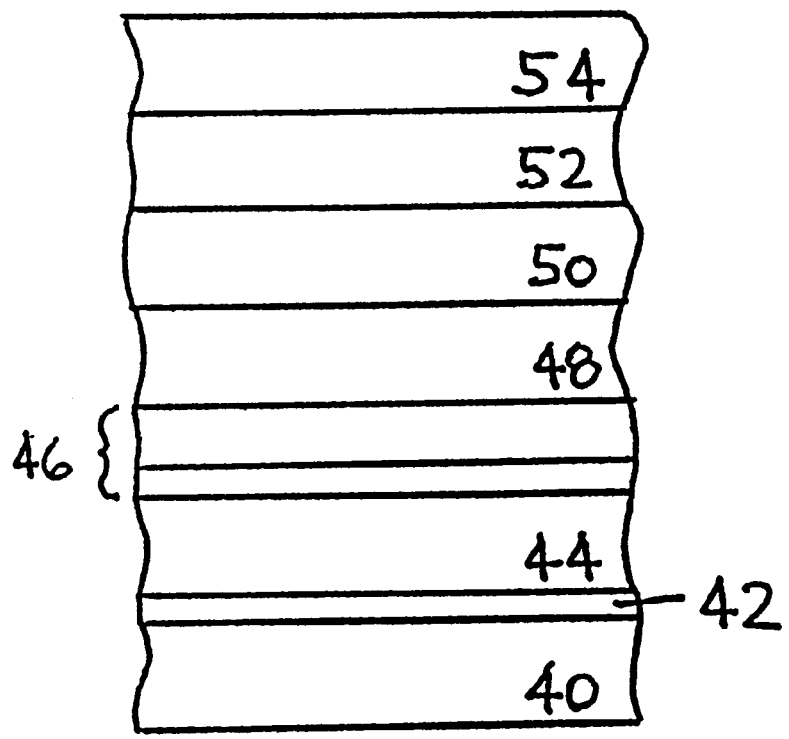

Referring to FIG. 2D, the second polysilicon layer is deposited. Specifically, a phosphorus doped amorphous polysilicon layer is deposited via CVD to form a doped polysilicon layer 48 at about 530° C., 400 mTorr, $SiH_4$ at 2,000 sccm, and a mixture of 1% by weight $PH_3$ in helium at about 75 sccm. Alternatively, the the second polysilicon layer can be deposited by LPCVD followed by ion implantation of a dopant such as phosphorus. Doping lowers the resistivity of the polysilicon rendering it conductive.

The remaining steps are generally well known in the art and may be varied. For instance, referring to FIG. 2E, in one embodiment a tungsten silicide layer 50 is deposited via, for example, LPCVD. The tungsten silicide layer 50 provides a lower resistance contact for improved flash memory cell performance. Poly-cap layer 52 is deposited over the tungsten silicide layer 50. The poly-cap layer 52 is about 500 Å thick, and is formed via, for example, LPCVD. The poly-cap layer 52 can be used to prevent any potential peeling or cracking of the underlying tungsten silicide 50. A capping layer 54, for example, of SiON is deposited over the poly-cap layer 52. The capping silicon oxynitride layer 54 provides an anti-reflective coating at masking and also acts as a masking layer for subsequent etching.

Figure 2F:
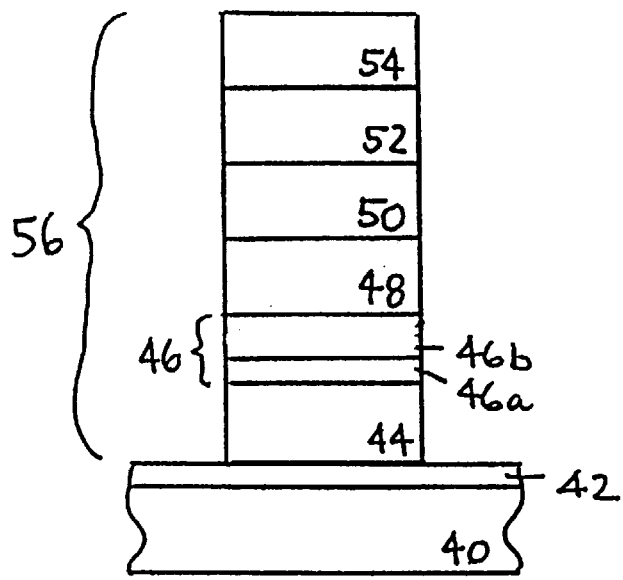
Figure 2G:
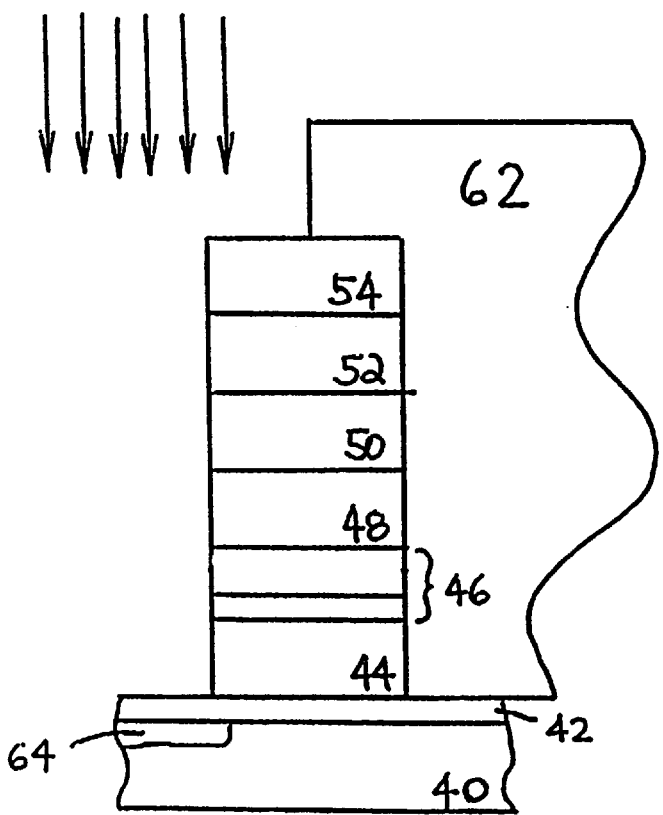

Referring to FIGS. 2F, suitable lithography and etching procedures are used to remove various portions of the device. After the second polysilicon layer 48, the tungsten silicide layer 50, the poly-cap layer 52 and the capping layer 54 have been formed (a plurality of word lines for the memory cells can be defined in this manner) etching is performed to define one or more pre-stack structures. The etching may be achieved by depositing and defining a photoresist masking layer over the entire surface of the substrate using standard lithography procedures. This is generally termed the gate mask and gate etch. Subsequently, a number of successive etching steps, such as the gate etch and the self aligned etch, are performed to define one or more stack structures 56. This is generally termed the self aligned mask and self aligned etch.

The gate mask and gate etch are performed as follows. First, a resist (not shown) is applied, selectively exposed to radiation and developed whereby various portions removed (either the exposed or unexposed portions). Next, in one embodiment, the etching steps take place in a multi-chamber etch tool wherein a silicon oxynitride capping layer is selectively etched with a fluorinated chemistry such as $CHF_3$—$O_2$ in an oxide chamber. The exposed poly-cap layer and the tungsten silicide layer are then etched with $SF_6$/HBr (or alternatively, $SF_6$/$Cl_2$ or $Cl_2$—$O_2$) and the exposed second polysilicon layer is etched with HBr—$O_2$ in a poly chamber. Etching steps are preferably formed in an integrated process in which the wafers are not exposed to atmosphere when transferring the wafers from one chamber to another.

Once the second polysilicon layer 48, the tungsten silicide layer 50, the poly-cap layer 52 and the capping layer 54 have been removed, a self aligned etch ("SAE") is performed to remove the bilayer interpoly dielectric 46 and the phosphorus doped polysilicon layer (first polysilicon layer) 44 in the regions that are not covered by the pre-stack structure (constituted by the unremoved second polysilicon layer, tungsten silicide layer, poly-cap layer and capping layer). The SAE etch is a two step etch process in which the bilayer interpoly dielectric 46 is first removed using, for example, an RIE etch. The second phase of the SAE etch is the removal of the exposed first polysilicon layer 44 to thereby further define the floating gate structures for each respective word line. The polysilicon etch includes, for example, an HBr—$O_2$ or a HBr—$Cl_2$—$O_2$ RIE etch chemistry. The gate etch and SAE serve to define the stack structure 56.

Figure 2H:
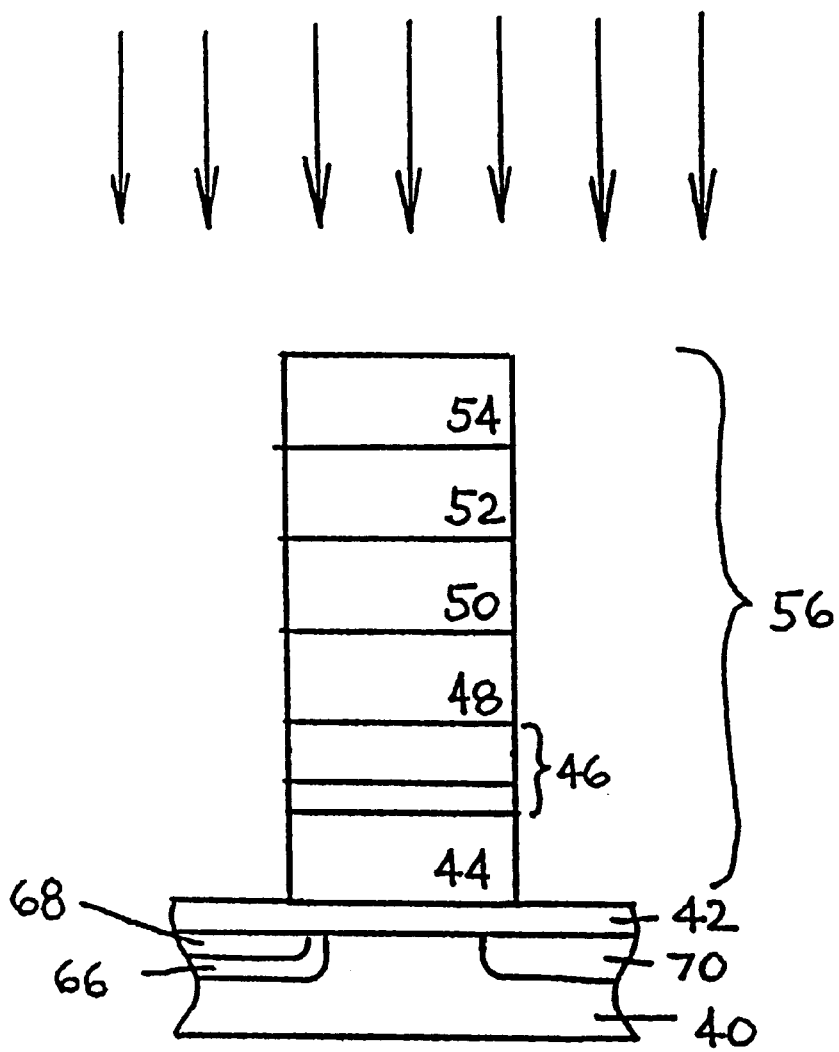

The fabrication of the flash memory cells is then completed by forming the source and drain regions by, for example, ion implantation. During the formation of the source and drain regions, the stacked gate structure 56 serves as a self-aligning mechanism. Specifically referring to FIG. 2G, resist 62 is applied and selectively stripped followed by performing a first ion implantation using phosphorus ($1 \times 10^{14}$ ions/$cm^2$ at 60 KeV) to form an N-type source region 64 (double diffused implant). Referring to FIG. 2H, resist 62 is removed followed by performing a second ion implantation using arsenic ($5 \times 10^{14}$ ions/$cm^2$ at 40 KeV) to form deep N-type source region 66, shallow N-type source region 68 and N-type drain region 70 (modified drain diffusion). Annealing completes the formation of the source and drain regions. In the above manner, an easy method for forming flash memory cells is provided. Although a flash memory cell with a double-diffused source region is described, the present invention is also applicable to flash memory cells with a single-diffused source region.

During programming, the source regions 66 and 68 and the substrate 40 of the memory cell may be tied to a ground via a terminal (not shown), respectively, the drain region 70 is coupled to a relatively high voltage (for example, between about +5 V to about +9 V) via a terminal (not shown) and the control gate 48 is connected to a relatively high voltage level (for example, above about +10 V) via a terminal (not shown). Electrons are accelerated from the source regions 66 and 68 to the drain region 70 and so-called "hot-electrons" are generated near the drain region 70. Some of the hot electrons are injected through the relatively thin tunmel oxide layer 42 and become trapped in the floating gate 44 thereby providing the floating gate 44 with a negative potential.

During erasure, a high positive voltage (such as above about +12 V) is applied to the source regions 66 and 68 via a source terminal (not shown). A ground potential ($V_g$ equals 0 V) is applied to the control gate 48 via the control terminal (not shown). A similar ground potential ($V_{sub}$ equals 0 V) is applied to the substrate 40 via a substrate terminal (not shown). The voltage $V_D$ of the drain region 70 is permitted to float. In this mode, electrons previously stored during programming in the floating gate 44 pass through tunnel oxide layer 42 by way of Fowler-Nordheim tunneling and travel into the source regions 66 and 68 as a result of the electric field established between the control gate 48 and the source regions 66 and 68 ($V_{GS}$ equals about 12 V). Since the bilayer interpoly dielectric 46 is characterized by reduced charge trapping, Fowler-Nordheim tunneling and travel of electrons from the floating gate 44 to the source regions 66 and 68 are facilitated.

Although the invention has been shown and described with respect to a certain preferred embodiment or embodiments, it is obvious that equivalent alterations and modifications will occur to others skilled in the art upon the reading and understanding of this specification and the annexed drawings. In particular regard to the various functions performed by the above described components (assemblies, devices, circuits, etc.), the terms (including a reference to a "means") used to describe such components are intended to correspond, unless otherwise indicated, to any component which performs the specified function of the described component (i.e., that is functionally equivalent), even though not structurally equivalent to the disclosed structure which performs the function in the herein illustrated exemplary embodiments of the invention. In addition, while a particular feature of the invention may have been disclosed with respect to only one of several embodiments, such feature may be combined with one or more other features of the other embodiments as may be desired and advantageous for any given or particular application.

What is claimed is:

1. A method of forming a flash memory cell, comprising:
    forming a tunnel oxide on a substrate;
    forming a first polysilicon layer over the tunnel oxide;
    forming an insulating layer on the first polysilicon layer, the insulating layer consisting essentially of an oxide layer over the first polysilicon layer, and a tantalum pentoxide layer over the oxide layer, wherein the tantalum pentoxide layer is made by chemical vapor deposition at a temperature from about 200° C. to about 650° C. using an organic tantalum compound and an oxygen compound, and heating in an $N_2O$ atmosphere at a temperature from about 700° C. to about 875° C.;
    forming a second polysilicon layer on the insulating layer;
    etching at least the first polysilicon layer, the second polysilicon layer and the insulating layer, thereby defining at least one stacked gate structure; and
    forming a source region and a drain region in the substrate, thereby forming at least one memory cell.

2. The method of claim 1, wherein the oxide layer is made by chemical vapor deposition at a temperature from about 600° C. to about 850° C. under a pressure from about 400 mTorr to about 800 mTorr using $SiH_4$ and $N_2O$.

3. The method of claim 1, wherein the organic tantalum compound comprises $Ta(OC_2H_5)_5$ and the oxygen compound comprises $O_2$.

4. The method of claim 1, wherein the tantalum pentoxide layer is made using from about 5 mg/min to about 20 mg/min of the organic tantalum compound and from about 500 sccm to about 2,000 sccm of the oxygen compound.

5. The method of claim 1, wherein the tantalum pentoxide layer is made under a pressure from about 200 mTorr to about 600 mTorr.

6. The method of claim 1, wherein the insulating layer has a thickness from about 130 Å to about 1,570 Å.

7. The method of claim 1, wherein the insulating layer has a dielectric constant above about 20.

8. A method of forming an insulating layer for a flash memory cell, consisting essentially of:
depositing an oxide layer having a thickness from about 30 Å to about 70 Å; and
depositing a tantalum pentoxide layer over the oxide layer, wherein the tantalum pentoxide layer is deposited by chemical vapor deposition using an organic tantalum compound, an oxygen compound and a carrier gas, and heating in an $N_2O$ atmosphere at a temperature from about 700° C. to about 875° C. for a time from about 40 seconds to about 80 seconds.

9. The method of claim 8, wherein the tantalum pentoxide layer has a thickness from about 100 Å to about 1,500 Å.

10. The method of claim 8, wherein the organic tantalum compound comprises $Ta(OC_2H_5)_5$, the oxygen compound comprises $O_2$, and the carrier gas comprises at least one of He, Ne, Ar, Kr, Xe, and $N_2$.

11. The method of claim 8, wherein the tantalum pentoxide layer is made using from about 6 mg/min to about 15 mg/min of the organic tantalum compound, from about 600 sccm to about 1,500 sccm of the oxygen compound, and from about 200 sccm to about 600 sccm of the carrier gas.

12. The method of claim 8, wherein the tantalum pentoxide layer is deposited by chemical vapor deposition at a temperature from about 300° C. to about 600° C. under a pressure from about 250 mTorr to about 500 mTorr.

13. The method of claim 8, wherein heating in the $N_2O$ atmosphere is conducted at a temperature from about 750° C. to about 850° C. for a time from about 50 seconds to about 70 seconds.

14. A method of forming a high K interpoly dielectric layer between a floating gate and a control gate in a flash memory cell comprising a substrate, a tunnel oxide over the substrate, the floating gate over the tunnel oxide, the high K interpoly dielectric layer on the floating gate, and the control gate on the high K interpoly dielectric layer, wherein the high K interpoly dielectric layer consists essentially of an oxide layer over the floating gate, and a tantalum pentoxide layer over the oxide layer, comprising:
forming an oxide layer having a thickness from about 30 Å to about 70 Å at a temperature below about 900° C.; and
forming a tantalum pentoxide layer over the oxide layer, wherein the tantalum pentoxide layer is deposited by chemical vapor deposition using an organic tantalum compound, an oxygen compound and a carrier gas at a temperature below about 700° C., and heating in an $N_2O$ atmosphere at a temperature below about 900° C., wherein the high K interpoly dielectric layer has a dielectric constant of at least about 20.

15. The method of claim 14, wherein the oxide layer is made by chemical vapor deposition at a temperature from about 700° C. to about 800° C. under a pressure from about 500 mTorr to about 700 mTorr using $SiH_4$ and $N_2O$.

16. The method of claim 14, wherein the tantalum pentoxide layer has a thickness from about 100 Å to about 1,000 Å.

17. The method of claim 14, wherein the organic tantalum compound comprises $Ta(OC_2H_5)_5$, the oxygen compound comprises $O_2$, and the carrier gas comprises He.

18. The method of claim 14, wherein the tantalum pentoxide layer is made by chemical vapor deposition at a temperature from about 200° C. to about 650° C. and a pressure from about 200 mTorr to about 600 mTorr using from about 6 mg/min to about 15 mg/min of the organic tantalum compound, from about 600 sccm to about 1,500 sccm of the oxygen compound, and from about 200 sccm to about 600 sccm of the carrier gas.

19. The method of claim 14, wherein the $N_2O$ atmosphere comprises at least about 95% $N_2O$.

20. The method of claim 14, wherein the high K interpoly dielectric layer has a dielectric constant of at least about 25.

21. The method of claim 1, wherein the second polysilicon layer is formed directly over the tantalum oxide layer of the insulating layer.

22. The method of claim 14, wherein the control gate is formed directly over the tantalum oxide layer of the high K interpoly dielectric layer.

23. The method of claim 14 wherein the high K interpoly dielectric layer consists of the oxide layer and the tantalum oxide layer.

24. A method of forming a flash memory cell, comprising:
forming a tunnel oxide on a substrate;
forming a first polysilicon layer over the tunnel oxide;
forming an insulating layer on the first polysilicon layer, the insulating layer consisting essentially of an oxide layer over the first polysilicon layer, and a tantalum pentoxide layer over the oxide layer, wherein the tantalum pentoxide layer is made by chemical vapor deposition at a temperature from about 200° C. to about 650° C. using an organic tantalum compound and an oxygen compound, and heating in an $N_2O$ atmosphere at a temperature from about 700° C. to about 875° C.;
forming a second polysilicon layer on the insulating layer;
forming a tungsten silicide layer over the second polysilicon layer;
etching at least the first polysilicon layer, the second polysilicon layer, the insulating layer and the tungsten silicide layer, thereby defining at least one stacked gate structure; and
forming a source region and a drain region in the substrate, thereby forming at least one memory cell.

25. The method of claim 24, wherein the oxide layer is made by chemical vapor deposition at a temperature from about 600° C. to about 850° C. under a pressure from about 400 mTorr to about 800 mTorr using $SiH_4$ and $N_2O$.

26. The method of claim 24, wherein the organic tantalum compound comprises $Ta(OC_2H_5)_5$ and the oxygen compound comprises $O_2$.

27. The method of claim 24, wherein the tantalum pentoxide layer is made using from about 5 mg/min to about 20 mg/min of the organic tantalum compound and from about 500 sccm to about 2,000 sccm of the oxygen compound.

28. The method of claim 24, wherein the tantalum pentoxide layer is made under a pressure from about 200 mTorr to about 600 mTorr.

29. The method of claim 24, wherein the insulating layer has a thickness from about 130 Å to about 1,570 Å.

30. The method of claim 24, wherein the insulating layer has a dielectric constant above about 20.

* * * * *

UNITED STATES PATENT AND TRADEMARK OFFICE
CERTIFICATE OF CORRECTION

PATENT NO. : 6,309,927 B1
DATED : October 30, 2001
INVENTOR(S) : Kenneth Wo-Wai Au et al.

It is certified that error appears in the above-identified patent and that said Letters Patent is hereby corrected as shown below:

Column 2,
Line 25, replace "a bilayer intelpoly" with -- a bilayer interpoly --

Column 3,
Line 64, replace "0.5l to about 2 lN$_2$O" with -- 0.5 l to about 2 l N$_2$O --

Column 7,
Line 29, replace "by forning the source" with -- by forming the source --
Line 57, replace "relatively thin tunmel" with -- relatively thin tunnel --

Signed and Sealed this

Twenty-third Day of July, 2002

Attest:

JAMES E. ROGAN
Attesting Officer  Director of the United States Patent and Trademark Office